(12) United States Patent
Shimada et al.

(10) Patent No.: US 6,946,926 B2
(45) Date of Patent: Sep. 20, 2005

(54) WIRED TRANSMISSION PATH WITH PLURAL EQUIDISTANT DIFFERENTIAL CONDUCTORS

(75) Inventors: Mikihiro Shimada, Daito (JP); Kaoru Ishida, Shijonawate (JP); Hiroyuki Asakura, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/469,032

(22) PCT Filed: Feb. 19, 2003

(86) PCT No.: PCT/JP03/01744
§ 371 (c)(1),
(2), (4) Date: Aug. 26, 2003

(87) PCT Pub. No.: WO03/073807
PCT Pub. Date: Sep. 4, 2003

(65) Prior Publication Data
US 2004/0085149 A1 May 6, 2004

(30) Foreign Application Priority Data
Feb. 26, 2002 (JP) .................................. 2002-050045

(51) Int. Cl.[7] .............................................. H01P 3/04
(52) U.S. Cl. .............................. 333/5; 333/4; 333/238
(58) Field of Search ............................ 333/1, 4, 5, 238

(56) References Cited

U.S. PATENT DOCUMENTS 3,815,054 A * 6/1974 McClure et al. ................ 333/5
5,966,056 A * 10/1999 Thornton ........................ 333/5

FOREIGN PATENT DOCUMENTS

JP          5-6910        1/1993

OTHER PUBLICATIONS

Patent Abstract of Japan, vol. 2000, No. 16, May 8, 2001 & JP 2001–015925 A (NEC Corp.), Jan. 19, 2001, Abstract.
Patent Abstract of Japan, vol. 2002, No. 09, Sep. 4, 2002 & JP 2002–158452 A (Fujitsu Ltd.), May 31, 2002, Abstract.

* cited by examiner

*Primary Examiner*—Benny Lee
(74) *Attorney, Agent, or Firm*—Wenderoth, Lind & Ponack, L.L.P.

(57) ABSTRACT

A wired transmission path includes first and second differential transmission paths. The first differential transmission path is composed of two strip lines, and the second differential transmission path is composed of two strip lines. Each of the strip lines of the first differential transmission path is disposed at an equal distance from the strip lines of the second differential transmission path. Thus, there is provided a wired transmission path including a plurality of differential transmission paths in such a manner so as to cancel crosstalk.

14 Claims, 9 Drawing Sheets

1 { 12, 13 }   12 { 125, 126 }   13 { 131, 132 }

1 { 12, 13 }   12 { 127, 128 }   13 { 133, 134 }

$1\begin{cases}12\\13\end{cases}\quad 12\begin{cases}141\\142\end{cases}\quad 13\begin{cases}143\\144\end{cases}$

US 6,946,926 B2

WIRED TRANSMISSION PATH WITH PLURAL EQUIDISTANT DIFFERENTIAL CONDUCTORS

TECHNICAL FIELD

The present invention relates to a wired transmission path, and more particularly to a wired transmission path comprising a plurality of differential transmission paths.

BACKGROUND ART

In recent years, a differential transmission path is often used as a wired transmission path for high-speed digital transmission. A differential transmission path transmits a differential signal, which consists of an in-phase signal and a reverse phase signal. Any noise occurring on a differential transmission path would be superimposed on both the in-phase signal and the reverse phase signal. Since substantially the same level of noise is superimposed on both signals, the superimposed noise can be cancelled out by taking a difference between the in-phase signal and the reverse phase signal outputted from the differential transmission path.

However, if a plurality (e.g., two) of differential transmission paths are deployed in close proximity, when differential signals are applied on both differential transmission paths, an electromagnetic field generated from one differential transmission path may cause crosstalk on the differential signal transmitted on the other differential transmission path.

Thus, an object of the present invention is to provide a wired transmission path which can cancel crosstalk.

SUMMARY OF THE INVENTION

To achieve the above object, the present invention has the following features in one aspect, thereby providing the following technological effects.

One aspect of the present invention is directed to a wired transmission path comprising: a plurality of differential transmission paths, each composed of two transmission lines, wherein each of the two transmission lines composing each differential transmission path is disposed at an equal distance from the two transmission lines composing any other differential transmission path.

Each of the two transmission lines composing each differential transmission path may be disposed in a position to receive a substantially equal intensity of electromagnetic field from the two transmission lines composing any other differential transmission path.

Based on the above features, crosstalk caused by a differential signal being transmitted on one of the differential transmission paths will be superimposed at the same level on a differential signal transmitted on the other differential transmission path. Therefore, the crosstalk can be canceled by taking a difference between the in-phase signal and the reverse phase signal outputted from the first differential transmission path. Furthermore, the above features make it unnecessary to shield the differential transmission paths from each other, whereby a high-density arrangement of the differential transmission paths becomes possible.

The plurality of differential transmission paths may be first and second differential transmission paths, each composed of two transmission lines, wherein each transmission line composing the first differential transmission path is disposed at an equal distance from the two transmission lines composing the second differential transmission path.

Each transmission line composing the first differential transmission path may be disposed in a position to receive a substantially equal intensity of electromagnetic field from the two transmission lines composing the second differential transmission path.

Preferably, the two transmission lines composing the first differential transmission path are arrayed along a vertical direction, and the two transmission lines composing the second differential transmission path are arrayed along a horizontal direction.

Based on the above features, crosstalk caused by a differential signal being transmitted on the second or first differential transmission path will be superimposed at the same level on a differential signal transmitted on the first or second differential transmission path. Therefore, the crosstalk can be canceled by taking a difference between the in-phase signal and the reverse phase signal outputted from the first differential transmission path. Furthermore, the above features make it unnecessary to shield the first and second differential transmission paths from each other, whereby a high-density arrangement of the first and second differential transmission paths becomes possible.

Each of the first and second differential transmission paths may be composed of two strip lines, two slot lines, or two coplanar lines.

One of the first and second differential transmission paths may be composed of two coplanar lines, and the other differential transmission path may be composed of two strip lines.

One of the first and second differential transmission paths may be composed of two slot lines, and the other differential transmission path may be composed of two strip lines.

One of the first and second differential transmission paths may be composed of two slot lines, and the other differential transmission path may be composed of two coplanar lines.

The wired transmission path may further comprise a connector at one end or both ends of the first and second differential transmission paths.

The wired transmission path may be implemented as a wiring plate. A circuit may be mounted on such a wiring plate.

Alternatively, the wired transmission path may be implemented as a respective component of laminated wiring plates.

Alternatively, the wired transmission path may be implemented as a cable.

These and other objects, features, aspects and advantages of the present invention will become more apparent from the following detailed description of the present invention when taken in conjunction with the accompanying drawings.

DETAILED DESCRIPTION OF THE INVENTION

Figure 1:
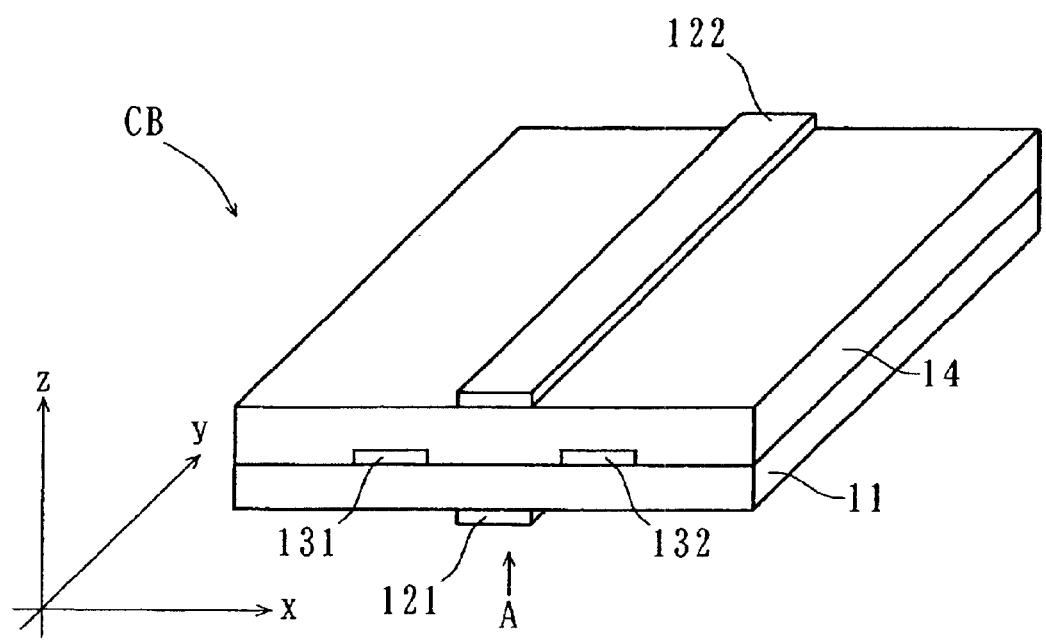
FIG. 1 is a perspective view illustrating a wiring plate CB comprising a wired transmission path 1 according to an embodiment of the present invention.

FIG. 1 is a perspective view illustrating a wiring plate CB comprising a wired transmission path 1 according to an embodiment of the present invention. FIG. 1 also shows an x axis, a y axis, and a z axis for facilitating the understanding of the following description. The x axis and the y axis are both contained in a horizontal plate, and are perpendicular to each other. The z axis extends in the vertical direction, lying perpendicular to both the x axis and the y axis. In FIG. 1 as such, the wiring plate CB comprises a substrate 11, a wired transmission path 1, and a prepreg 14. The wired transmission path is composed of a first differential transmission path 12 and a second differential transmission path 13.

Hereinafter, the wiring plate CB will be described in detail, mainly with respect to a method for producing the wiring plate CB. The substrate 11 may be composed of glass epoxy, e.g., FR-4, and is insulative. Instead of glass epoxy, the substrate 11 may be composed of BT (Bismaleimide Triazine) resin, polyimide, or PPE (PolyPhenylene Ether) resin. As illustrated in FIG. 1, the substrate 11 is a rectangular parallelepiped, e.g., a sheet or a plate, which has an upper face and a lower face which are parallel to the xy plane.

Figure 2:
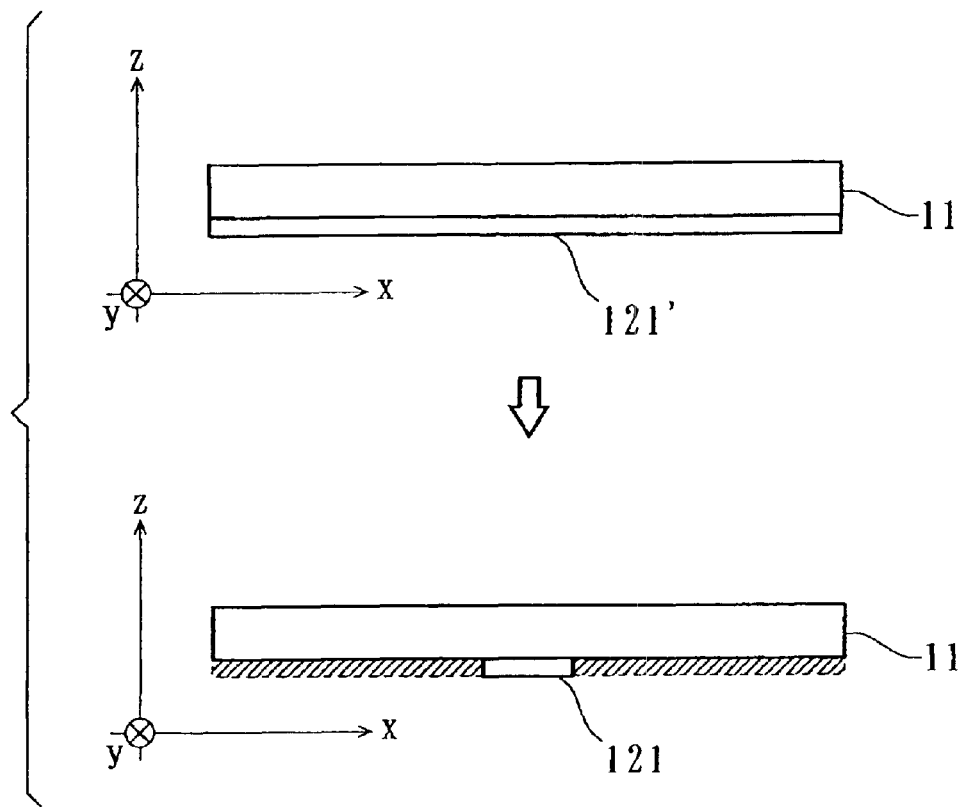
FIG. 2 is a diagram illustrating a process of forming a strip line 121 shown in FIG. 1.
Figure 3:
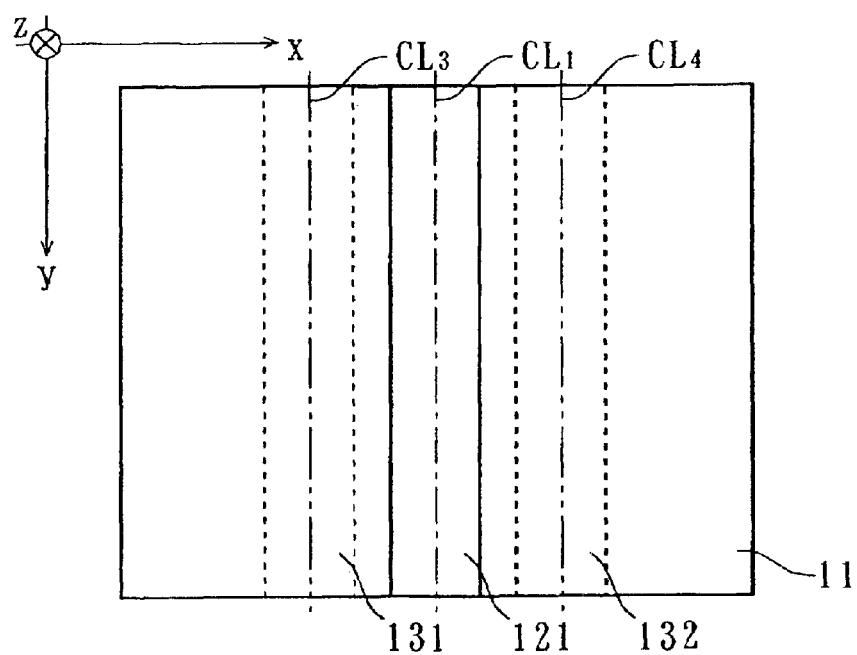
FIG. 3 is a bottom view illustrating a wiring plate CB shown in FIG. 1.

The first differential transmission path 12 is composed of a pair of strip lines 121 and 122 (as an example of "transmission lines" as used herein). FIG. 2 is a diagram illustrating a process of forming the strip line 121 shown in FIG. 1. FIG. 3 is a bottom view illustrating the wiring plate CB shown in FIG. 1, as viewed from the direction of arrow A shown in FIG. 1. Hereinafter, the strip line 121 will be specifically described with reference to FIGS. 2 and 3. First, as shown in the upper image of FIG. 2, a conductor 121' (e.g., a copper foil) is attached on the lower face of the substrate 11. Thereafter, as shown in the lower image of FIG. 2, unnecessary portions (shown hatched in FIG. 2) of the attached conductor 121' are removed by a technique such as etching, whereby the strip line 121 is formed on the lower face of the substrate 11. As shown in FIG. 3, a center line $CL_1$ (shown by a dot-dash line) of the strip line 121 along a longitudinal direction is parallel to the y axis. The details of the strip line 122 will be described later.

Similarly to the first differential transmission path 12, the second differential transmission path 13 is also composed of a pair of strip lines 131 and 132, as shown in FIG. 1. The outer dimensions of the strip lines 131 and 132 may be different from the outer dimensions of the strip lines 121 and 122. However, the present embodiment conveniently assumes that the strip lines 131 and 132 have substantially the same outer dimensions as the outer dimensions of the strip lines 121 and 122. The strip lines 131 and 132 are formed on an upper face (opposite from the lower face of the substrate 11), in a manner similar to forming the strip line 121. As shown in FIG. 3, respective center lines $CL_3$ and $CL_4$ (shown by double-dot-dash lines) of the strip lines 131 and 132 along the longitudinal direction are parallel to they axis, and share substantially the same z coordinate value.

Figure 4:
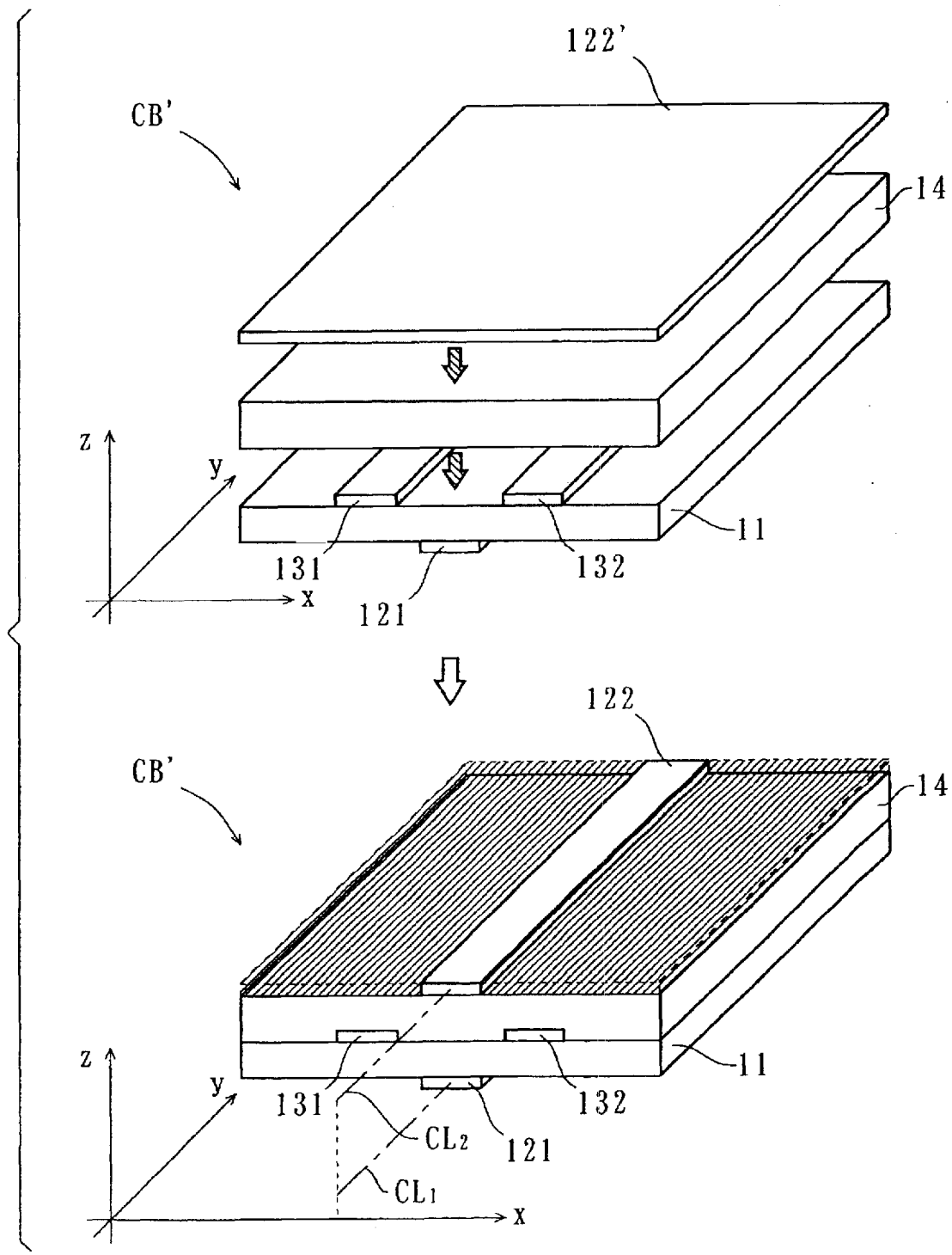
FIG. 4 is a diagram illustrating a process of shaping a wiring plate CB shown in FIG. 1.

Furthermore, as shown in the upper image of FIG. 4, a prepreg 14 is laid on the upper face of the substrate 11, on which the second differential transmission path 13 has already been formed. Furthermore, a conductor 122' (e.g., a copper foil), from which the strip line 122 is to be made, is laid on the upper face of the prepreg 14. By applying heat and pressure to this composite, a copper-surfaced laminated plate CB' is formed. Note that the upper face of the copper-surfaced laminated plate CB' is parallel to the lower face of the substrate 11. After the copper-surfaced laminated plate CB' has been formed, as shown in the lower image of FIG. 4, unnecessary portions (shown hatched in FIG. 4) of the laminated conductor 122' are removed by a technique such as etching, whereby the strip line 122 is formed on the upper face of the prepreg 14. Thus, the wiring plate CB shown in FIG. 1 is completed. As shown in the lower image of FIG. 4, a center line $CL_2$ of the strip line 122 along the longitudinal direction is parallel to the y axis. The center lines $CL_1$ and $CL_2$ share substantially the same x coordinate value.

Figure 5:
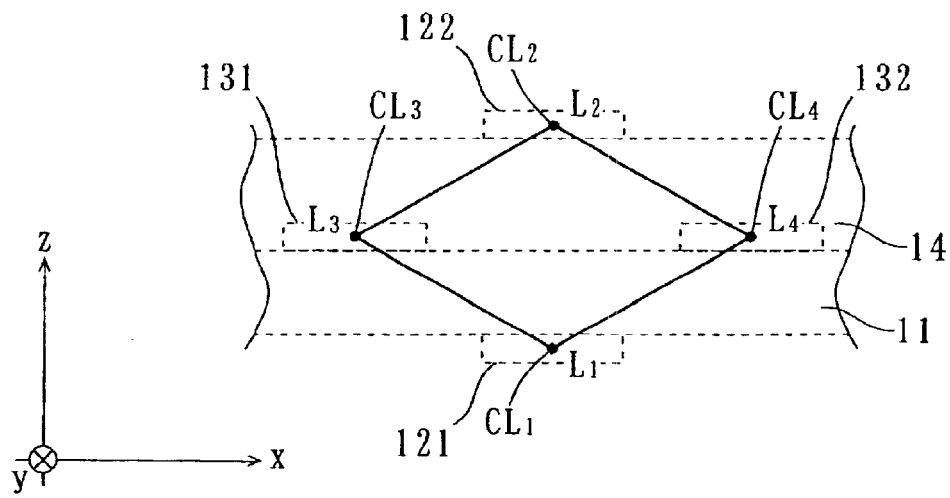
FIG. 5 is a diagram illustrating relative positions of strip lines 121, 122, 131, and 132 shown in FIG. 1.

The relative positions of the strip lines 121, 122, 131, and 132 will be more specifically described. In order to facilitate the description, as shown in FIG. 5, it is assumed that the position of the center line $CL_1$ on the xz plane will be denoted as $L_1$, and that the positions of the center lines $CL_2$ $CL_3$, $CL_4$ on the xz plane will be denoted as $L_2$, $L_3$, $L_4$, respectively. Under this assumption, the strip lines 121, 122, 131, and 132 are disposed so that segments $L_1L_3$, $L_1L_4$, $L_2L_3$, and $L_2L_4$ become substantially equal in length.

When two different differential signals are transmitted on the first differential transmission path 12 and the second differential transmission path 13, an electromagnetic field is generated around each of the strip lines 121, 122, 131, and 132. As a result, the electromagnetic fields generated from the strip lines 131 and 132 may cause crosstalk on the differential signal which is transmitted on the first differential transmission path 12. However, according to the present embodiment, each of the strip lines 121 and 122 is disposed at an equal distance from both strip lines 131 and 132, as described above. Therefore, the resulting electromagnetic field intensity is the same on both center lines $CL_1$ and $CL_2$. In other words, there is a symmetrical electromagnetic field distribution with respect to a plane containing the center lines $CL_3$ and $CL_4$. As a result, substantially the same level of crosstalk is superimposed on a pair of signals constituting the differential signal transmitted on the first differential transmission path 12. Therefore, the crosstalk can be cancelled out by taking a difference between the in-phase signal and the reverse phase signal outputted from the first differential transmission path 12. The same is also true of the differential signal which is transmitted on the second differential transmission path 13.

Thus, according to the present embodiment, the first differential transmission path 12 and the second differential transmission path 13 are disposed so as to obtain a symmetrical electromagnetic field distribution, whereby it becomes possible to realize the wired transmission path 1 which can cancel crosstalk. As is clear from the above description, there is no need to provide means of electromagnetic field shielding for the wiring plate CB. Therefore, it becomes possible to obtain a high-density arrangement of the first differential transmission path 12 and the second differential transmission path 13 on the wiring plate CB. The high-density wiring also makes it possible to downsize any electric circuit employing the wiring plate CB.

Figure 15:
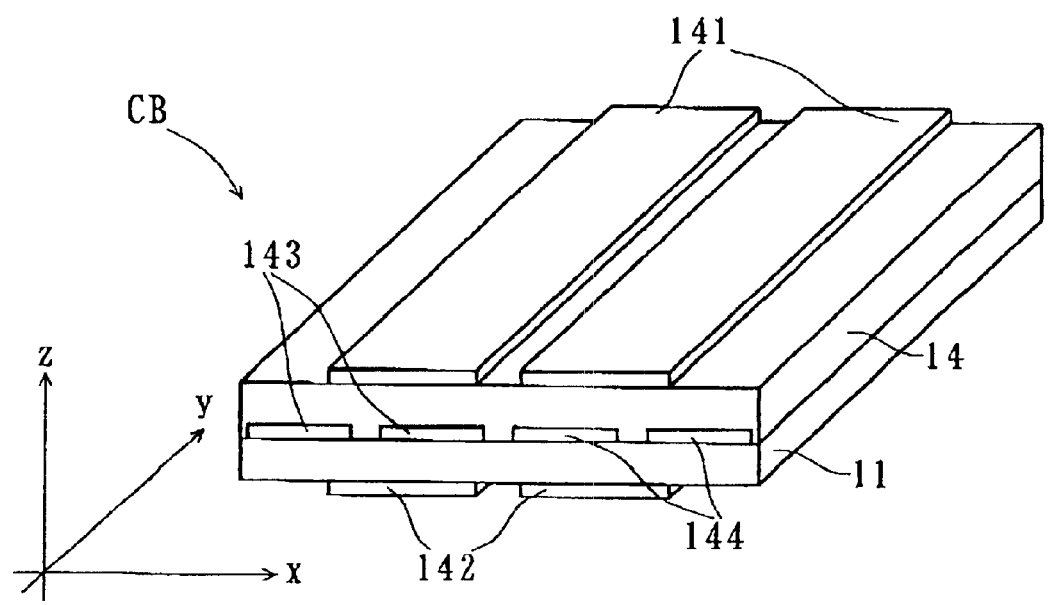
FIG. 15 is a vertical cross-sectional view illustrating a ninth variant of the wiring plate CB shown in FIG. 1 in which a wired transmission path 1 comprises tow sets of slot lines.

Although the above-described embodiment illustrates an example where both the first differential transmission path 12 and the second differential transmission path 13 are composed of strip lines, the present invention is not limited thereto. Both the first differential transmission path 12 and the second differential transmission path 13 may be composed of slot lines. FIG. 15 illustrates an example where each of the first and second differential transmission paths 12 and 13 is composed of two slot lines. As shown in FIG. 15, the first differential transmission path 12 is composed of slot lines 141 and 142, and the second differential transmission path 13 is composed of slot lines 143 and 144.

Figure 14:
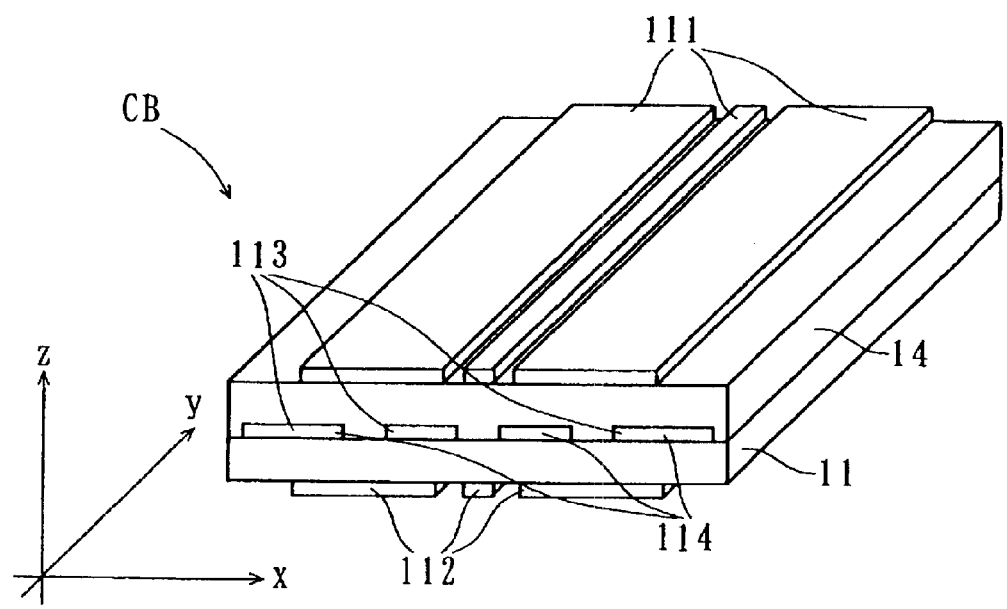
FIG. 14 is a vertical cross-sectional view illustrating an eight variant of the wiring plate CB shown in FIG. 1 in which a wired transmission path 1 comprises two sets of coplanar lines.

Alternatively, both of the first transmission path 12 and the second transmission path 13 may be composed of coplanar lines. FIG. 14 illustrates an example where each of the first and second differential transmission paths 12 and 13 is composed of two coplanar lines. As shown in FIG. 14, the first differential transmission path 12 is composed of coplanar lines 111 and 112, and the second differential transmission path 13 is composed of coplanar lines 113 and 114.

Figure 6:
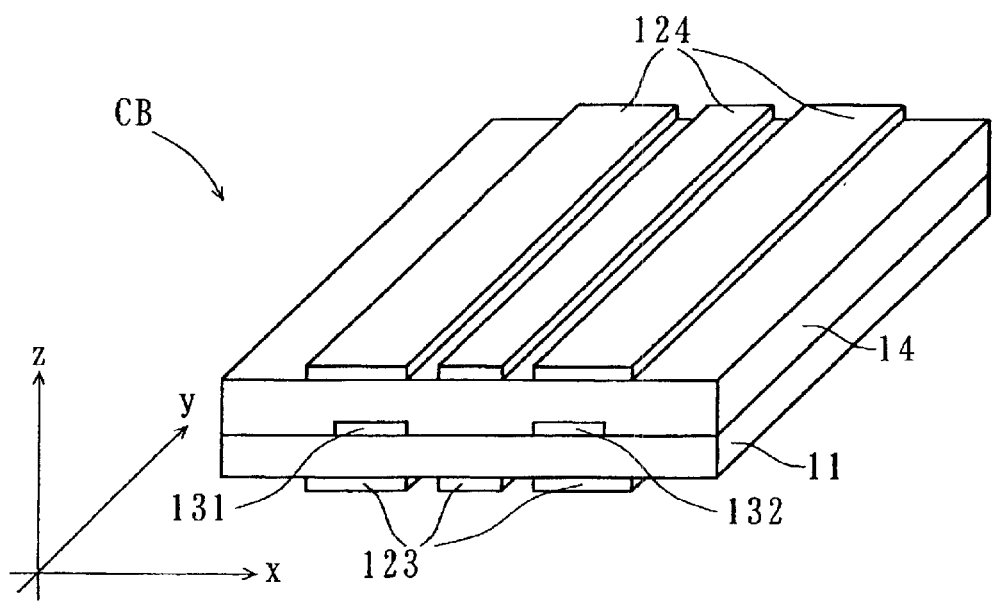
FIG. 6 is a perspective view illustrating a first variant of a wiring plate CB shown in FIG. 1.
Figure 7:
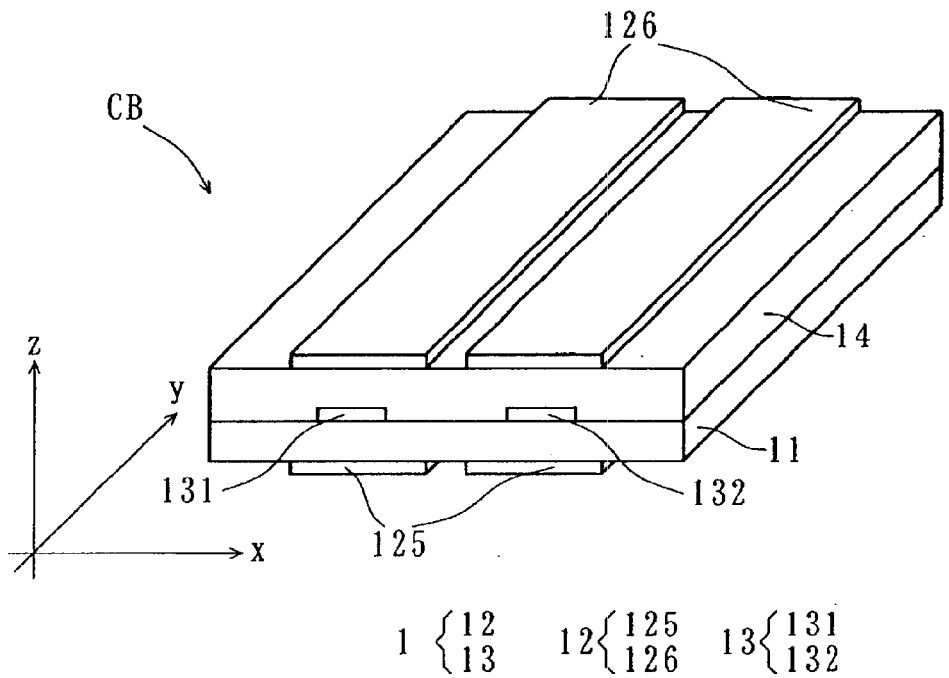
FIG. 7 is a vertical cross-sectional view illustrating a second variant of a wiring plate CB shown in FIG. 1.
Figure 8:
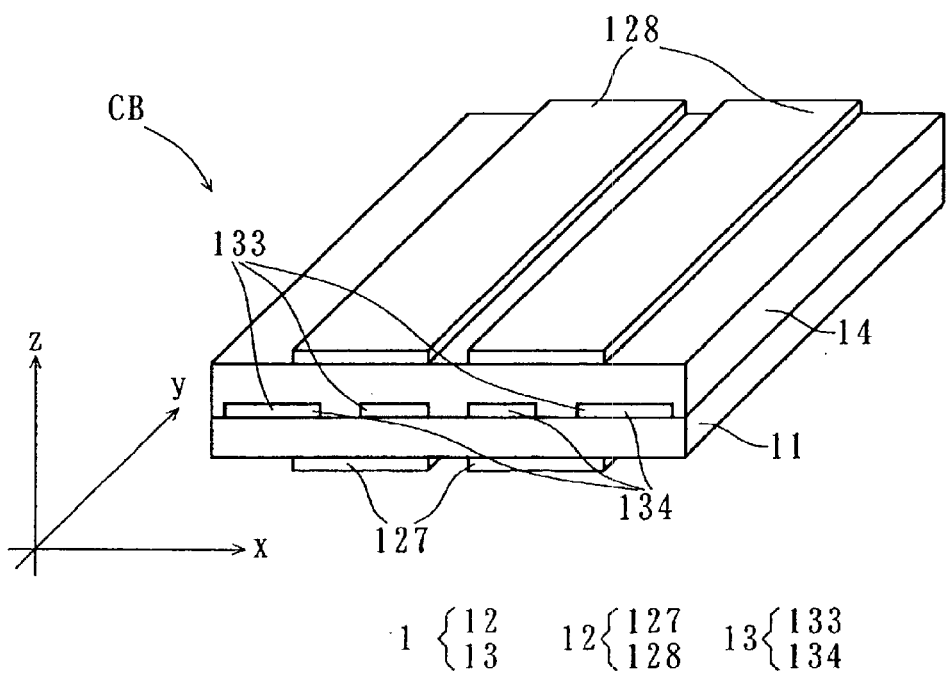
FIG. 8 is a vertical cross-sectional view illustrating a third variant of a wiring plate CB shown in FIG. 1.

Moreover, one of the first differential transmission path 12 and the second differential transmission path 13 may be composed of coplanar lines, the other path maybe composed of strip lines. FIG. 6 illustrates an example where the first differential transmission path 12 is composed of coplanar lines 123 and 124, whereas the second differential transmission path 13 is composed of strip lines 131 and 132. Alternatively, one of the first differential transmission path 12 and the second differential transmission path 13 may be composed of slot lines, the other path being composed of strip lines. FIG. 7 illustrates an example where the first differential transmission path 12 is composed of slot lines 125 and 126, whereas the second differential transmission path 13 is composed of strip lines 131 and 132. Alternatively, one of the first differential transmission path 12 and the second differential transmission path 13 may be composed of slot lines, and the other path being composed of coplanar lines. FIG. 8 illustrates an example where the first differential transmission path 12 is composed of slot lines 127 and 128, whereas the second differential transmission path 13 is composed of coplanar lines 133 and 134.

Figure 9:
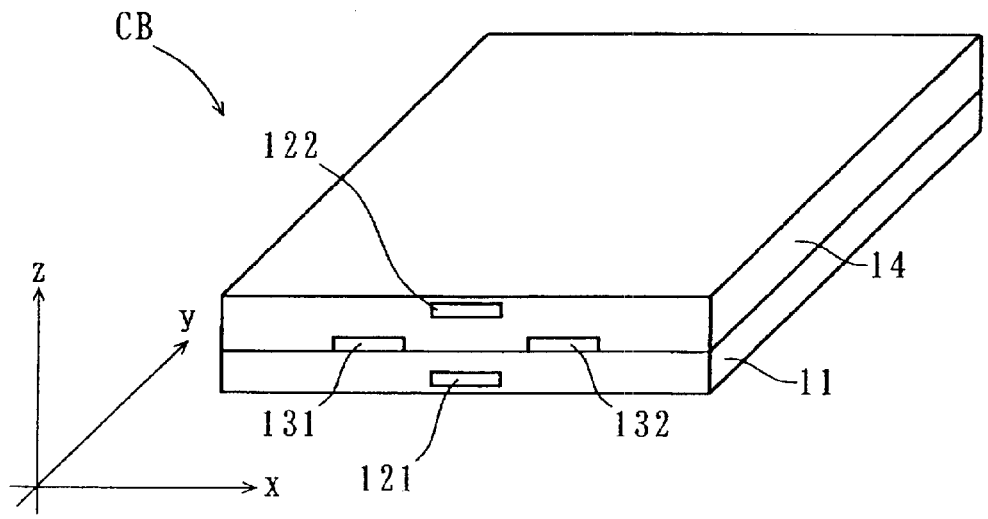
FIG. 9 is a perspective view illustrating a fourth variant of a wiring plate CB shown in FIG. 1.

Although the above embodiment illustrates an example where the strip line 121 is formed on the lower face of the substrate 11 and the strip line 122 is formed on the upper face of the prepreg 14, the present invention is not limited thereto. As shown in FIG. 9, the strip line 121 may be formed inside the substrate 11, and the strip line 122 may be formed inside the prepreg 14. Note, however, that the strip lines 121, 122, 131, and 132 in this case must also retain the relative positions illustrated in FIG. 5. Similarly, the first differential transmission path 12 shown in any of FIGS. 6–8 may also be formed inside the substrate 11 and inside the prepreg 14.

Although the above embodiment illustrates an example where, as shown in FIG. 4, the wiring plate CB is formed by laminating the prepreg 14 and the conductor 122', the present invention is not limited thereto. The wiring plate CB may be formed by clamping together a plurality of substrates 11 and conductors 122'. Alternatively, an insulation layer may be formed on the upper face of the substrate 11, and metal plating (such as copper plating) may be performed upon such an insulation layer. Thereafter, one of the transmission lines (see FIG. 1, and FIGS. 6–8) composing the first differential transmission path 12 maybe formed through a patterning process.

Figure 10:
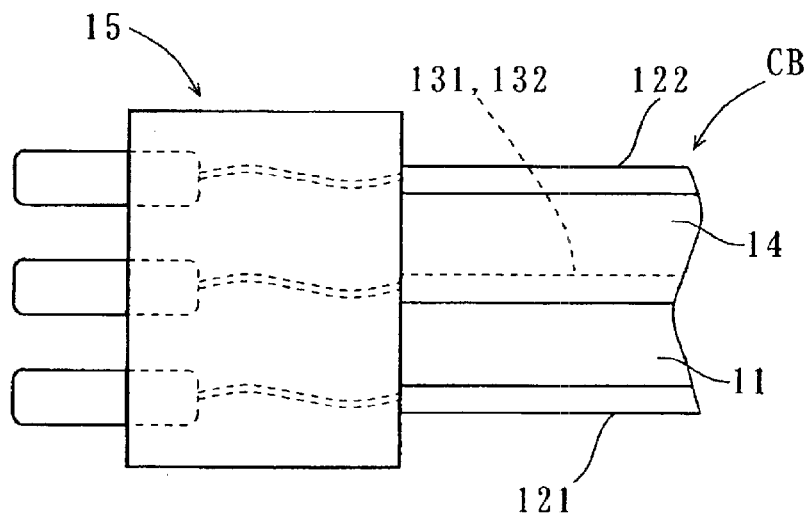
FIG. 10 is a side view illustrating a fifth variant of a wiring plate CB shown in FIG. 1.
Figure 11:
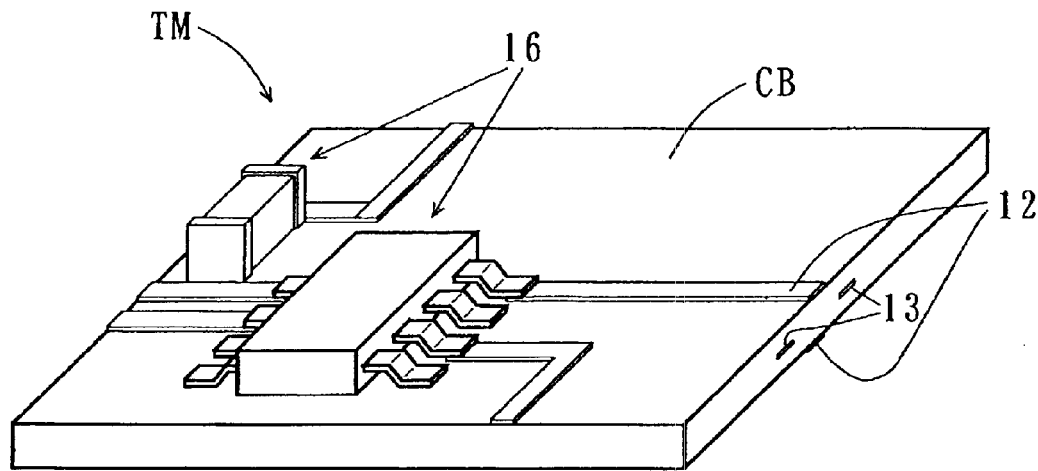
FIG. 11 is a perspective view illustrating a sixth variant of a wiring plate CB shown in FIG. 1.

Moreover, as shown in the side view of FIG. 10, a connector 15 may be coupled to one end or both ends of the first differential transmission path 12 and the second differential transmission path 13 (FIG. 10 illustrates a case where the connector 15 is coupled only to one end). Furthermore, as shown in FIG. 11, a circuit 16 composed of a semiconductor integrated circuit and/or circuit elements (resistors, capacitances or inductances) may be mounted on the above-described wiring plate CB, thereby realizing a transmission module TM.

Figure 12:
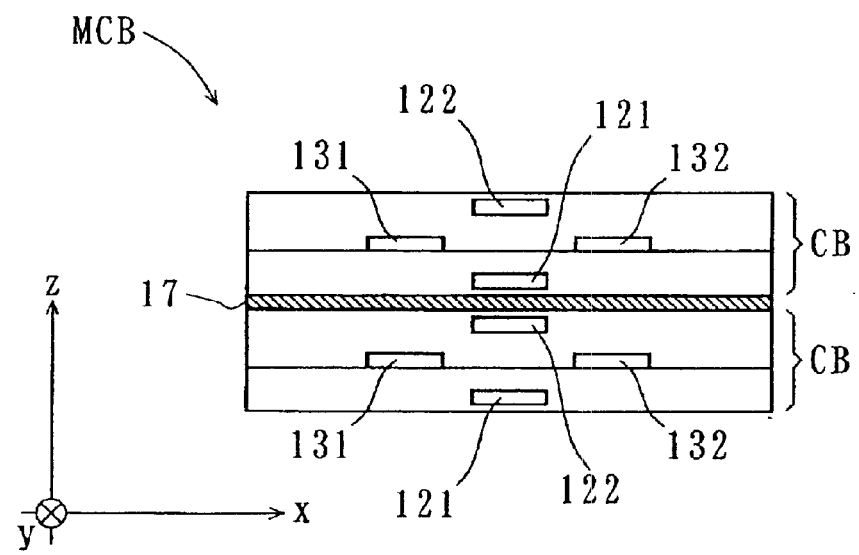
FIG. 12 is a vertical cross-sectional view illustrating a multilayer wiring plate MCB as a seventh variant of a wiring plate CB shown in FIG. 1.

Although a single-layer wiring plate CB is illustrated in each of the above examples, the present invention is not limited thereto. Depending on the purpose, as shown in FIG. 12, two or more wiring plates CB may be laminated (two such wiring plates CB are illustrated in FIG. 12), and used as a multilayer wiring plate MCB. In this case, in order to cancel crosstalk, it is preferable to form an insulation layer 17 between any two wiring plates CB adjoining each other along the z axis direction. Moreover, in the multilayer wiring plate MCB shown in FIG. 12, a plurality of differential transmission paths may be connected via through holes.

Figure 13:
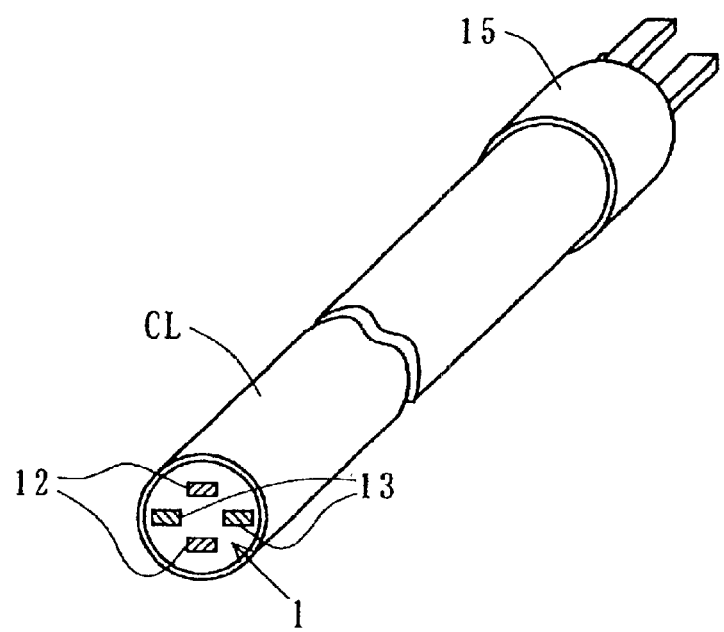
FIG. 13 is a perspective view illustrating a cable CL comprising a wired transmission path 1 shown in FIG. 1.

Although the above-described examples illustrate the case where the wired transmission path 1 is implemented in the form of a wiring plate CB, the present invention is not limited thereto. As shown in FIG. 13, the wired transmission path 1 may be implemented as a cable CL for use in data communications. At one end of the cable CL shown in FIG. 13, a connector 15 as described above is coupled. The transmission module TM shown in FIG. 11 and/or the cable CL shown in FIG. 13 may be incorporated in various communication devices.

Although the above examples illustrate the case where the wiring plate CB or the cable CL includes two differential transmission paths 12 and 13, the present invention is not limited thereto. The wiring plate CB or the cable CL may include three or more differential transmission paths. In this case, the transmission lines composing the respective differential transmission paths must take the relative positions that are illustrated with reference to FIG. 5.

While the invention has been described in detail, the foregoing description is in all aspects illustrative and not restrictive. It is understood that numerous other modifications and variations can be devised without departing from the scope of the present invention.

INDUSTRIAL APPLICABILITY

The wired transmission path according to the present invention is useful as a wiring plate which is required to have high-speed digital transmission capabilities.

What is claimed is:
1. A wired transmission path comprising:
a plurality of differential transmission paths, each composed of two transmission lines;
wherein each of said two transmission lines composing each of said plurality of differential transmission paths is disposed at an equal distance from said two trans- mission lines composing any of the other plurality of differential transmission paths;

wherein a first one of said plurality of differential transmission paths is composed of two slot lines, and a second one of said plurality of differential transmission paths is composed of two coplanar lines.

2. A wired transmission path comprising:

a plurality of differential transmission paths, each composed of two transmission lines, wherein each of the two transmission lines composing each of said plurality of differential transmission path is disposed at an equal distance from the two transmission lines composing any other differential transmission path;

wherein a first one of said plurality of differential transmission paths and a second one of said plurality of differential transmission paths are each composed of two slot lines.

3. A wired transmission path comprising:

a plurality of differential transmission paths, each composed of two transmission lines;

wherein each of said two transmission lines composing each of said plurality of differential transmission paths is disposed at an equal distance from said two transmission lines composing any of the other plurality of differential transmission paths;

wherein a first one of said plurality of differential transmission paths and a second one of said plurality of differential transmission paths are each compose of two coplanar lines.

4. A wired transmission path comprising:

a plurality of differential transmission paths, each composed of two transmission lines;

wherein each of said two transmission lines composing each of said plurality of differential transmission paths is disposed at an equal distance from said two transmission lines composing any of the other plurality of differential transmission paths;

wherein a first one of said plurality of differential transmission paths is composed of two coplanar lines, and a second one of said plurality of differential transmission paths is composed of two strip lines.

5. A wired transmission path comprising:

a plurality of differential transmission paths, each composed two transmission lines;

wherein each of said two transmission lines composing each of said plurality of differential transmission paths is disposed at an equal distance from said two transmission lines composing any of the other plurality of differential transmission paths;

wherein a first one of said plurality of differential transmission paths is composed of two slot lines, and a second one of said plurality of differential transmission paths is composed of two strip lines.

6. The wired transmission path according to one of the claims 2–1, wherein each of said two transmission lines composing any one of said plurality of differential transmission paths is disposed in a position so as to receive a substantially equal intensity of an electromagnetic field from said two transmission lines composing any other differential transmission path of said plurality of differential paths.

7. The wired transmission path according to one of claims 2–1, wherein said plurality of differential transmission paths are first and second differential transmission paths.

8. The wired transmission path according to claim 7, wherein said wired transmission path is implemented as a cable.

9. The wired transmission path according to claim 7, wherein each transmission line composing said first differential transmission path is disposed in a position so as to receive a substantially equal intensity of an electromagnetic field from said two transmission lines composing said second differential transmission path.

10. The wired transmission path according to claim 7, wherein said two transmission lines composing said first differential transmission path are arrayed along a vertical direction, and said two transmission lines composing said second differential transmission path are arrayed along a horizontal direction.

11. The wired transmission path according to claim 7, wherein said wired transmission path is implemented as a respective component of laminated wiring plates.

12. The wired transmission path according to claim 7, further comprising a connector at one end or both ends of said first and second differential transmission paths.

13. The wired transmission path according to claim 7, wherein said wired transmission path is implemented as a wiring plate.

14. The wired transmission path according to claim 13, wherein a circuit is mounted on said wiring plate.

* * * * *

UNITED STATES PATENT AND TRADEMARK OFFICE
CERTIFICATE OF CORRECTION

PATENT NO. : 6,946,926 B2
DATED : September 20, 2005
INVENTOR(S) : Mikihiro Shimada et al.

It is certified that error appears in the above-identified patent and that said Letters Patent is hereby corrected as shown below:

Column 7,
Line 9, replace "," with -- ; -- after "lines".
Line 10, replace "the" with -- said -- after "of" and before "two".
Line 11, replace "path" with -- paths -- after "transmission" and before "is".
Line 12, replace "the" with -- said -- after "from" and before "two".
Line 13, add -- of the -- after "any" and before "other".
Line 13, add -- plurality of -- after "other" and before "differential".
Line 14, replace "path" with -- paths --.
Line 29, replace "compose" with -- composed -- after "each" and before "of".

Signed and Sealed this

Twenty-eighth Day of February, 2006

JON W. DUDAS
*Director of the United States Patent and Trademark Office*

UNITED STATES PATENT AND TRADEMARK OFFICE
CERTIFICATE OF CORRECTION

PATENT NO. : 6,946,926 B2  Page 1 of 1
DATED : September 20, 2005
INVENTOR(S) : Mikihiro Shimada et al.

It is certified that error appears in the above-identified patent and that said Letters Patent is hereby corrected as shown below:

<u>Column 7,</u>
Line 9, replace "," with -- ; -- after "lines".
Line 10, replace "the" with -- said -- after "of" and before "two".
Line 11, replace "path" with -- paths -- after "transmission" and before "is".
Line 12, replace "the" with -- said -- after "from" and before "two".
Line 13, add -- of the -- after "any" and before "other".
Line 13, add -- plurality of -- after "other" and before "differential".
Line 14, replace "path" with -- paths --.
Line 29, replace "compose" with -- composed -- after "each" and before "of".

Signed and Sealed this

Sixteenth Day of May, 2006

JON W. DUDAS
*Director of the United States Patent and Trademark Office*

UNITED STATES PATENT AND TRADEMARK OFFICE
CERTIFICATE OF CORRECTION

PATENT NO. : 6,946,926 B2  Page 1 of 1
APPLICATION NO. : 10/469032
DATED : September 20, 2005
INVENTOR(S) : Mikihiro Shimada et al.

It is certified that error appears in the above-identified patent and that said Letters Patent is hereby corrected as shown below:

IN THE CLAIMS

Claim 6
In Column 8, Line 10, please remove "the" after "of".

In Column 8, Line 11, please replace "2-1" with --1-5-- after "claims" and before ",".

Claim 7
In Column 8, Line 18, please replace "2-1" with --1-5-- before ",".

Signed and Sealed this

Third Day of June, 2008

JON W. DUDAS
*Director of the United States Patent and Trademark Office*